United States Patent
Donati et al.

(10) Patent No.: US 8,286,406 B2
(45) Date of Patent: Oct. 16, 2012

(54) INDUCTION SEALING DEVICE FOR PRODUCING POURABLE FOOD PACKAGES

(75) Inventors: Andrea Donati, Castelnuovo Rangone (IT); Nikolay Madzharov, Drianovo (BG); Antonio Melandri, Rubiera (IT); Fabrizio Sighinolfi, Nonantola (IT)

(73) Assignee: Tetra Laval Holdings & Finance S.A., Pully (CH)

( * ) Notice: Subject to any disclaimer, the term of this patent is extended or adjusted under 35 U.S.C. 154(b) by 444 days.

(21) Appl. No.: 12/672,002

(22) PCT Filed: Aug. 13, 2008

(86) PCT No.: PCT/EP2008/060650
§ 371 (c)(1),
(2), (4) Date: Feb. 3, 2010

(87) PCT Pub. No.: WO2009/021979
PCT Pub. Date: Feb. 19, 2009

(65) Prior Publication Data
US 2011/0225929 A1    Sep. 22, 2011

(30) Foreign Application Priority Data

Aug. 14, 2007 (EP) .................................... 07425531

(51) Int. Cl.
*B65B 51/10* (2006.01)
*H05B 6/14* (2006.01)
(52) U.S. Cl. ....... 53/373.7; 53/551; 53/374.3; 53/375.9; 219/618
(58) Field of Classification Search .................... 53/477, 53/451, 551, 373.7, 374.3, 374.5, 375.9, 53/376.2; 219/618–633; 307/34, 35, 38–41; 373/104, 108
See application file for complete search history.

(56) References Cited

U.S. PATENT DOCUMENTS 3,710,062 A    1/1973    Peters, Jr.
(Continued)

FOREIGN PATENT DOCUMENTS

EP    1 620 249 B1    8/2006
(Continued)

OTHER PUBLICATIONS

International Search Report mailed on Dec. 8, 2008 by the European Patent Office as the International Searching Authority in International Application No. PCT/EP2008/060650.

(Continued)

*Primary Examiner* — Hemant M Desai
(74) *Attorney, Agent, or Firm* — Buchanan Ingersoll & Rooney PC (57) ABSTRACT

An induction sealing device for producing packaged pourable food products from heat-seal sheet packaging material. The sealing device has a signal source, an inductor, and an impedance matching circuit connected between the signal source and the inductor. The impedance matching circuit has: two input terminals; a first and second line connected to the input terminals; a variable-capacitance stage having capacitive modules each made up of a capacitive element and a controlled switch; and a control stage to control the controlled switches. Each controlled switch includes: input terminals receiving a respective control signal from the control stage, with one input terminal of each controlled switch connected to the second line; a single two-way controlled switching element having a control terminal connected to the other input terminal of the controlled switch; a first current-conducting terminal connected to the first line, and a second current-conducting terminal connected to the second line.

12 Claims, 7 Drawing Sheets

U.S. PATENT DOCUMENTS

| | | | |
|---|---|---|---|
| 4,151,387 A | | 4/1979 | Peters, Jr. |
| 4,511,956 A | * | 4/1985 | Dewan et al. ................... 363/49 |
| 5,170,040 A | * | 12/1992 | Wirtz et al. ................... 219/497 |
| 5,250,777 A | * | 10/1993 | Fishman ....................... 219/619 |
| 5,450,305 A | | 9/1995 | Boys et al. |
| 5,523,631 A | * | 6/1996 | Fishman et al. ................ 307/38 |
| 6,608,291 B1 | | 8/2003 | Collins et al. |
| 7,538,302 B2 | * | 5/2009 | Ferrari et al. ................. 219/633 |
| 2006/0242928 A1 | | 11/2006 | Ferrari et al. |

FOREIGN PATENT DOCUMENTS

| | | |
|---|---|---|
| JP | 60-50885 | 3/1985 |
| WO | WO 2004/085253 A2 | 10/2004 |

OTHER PUBLICATIONS

Written Opinion mailed on Dec. 8, 2008 by the European Patent Office as the International Searching Authority in International Application No. PCT/EP2008/060650.

\* cited by examiner

| # | C [nF] | ΣC [nF] |
|---|---|---|
| C1 | 6.8 | |
| C2 | 3.3 | |
| C3 | 1.8 | |
| C4 | 1 | 12.9 |
| C9 | 3.9 | |
| C10 | 3.9 | |
| C11 | 3.9 | |
| C12 | 3.9 | |
| C13 | 3.3 | 18.9 |
| | | 31.8 |

Fig. 6a

| # | C [nF] | ΣC [nF] |
|---|---|---|
| C1 | 6.8 | |
| C2 | 3.3 | |
| C3 | 1.8 | |
| C4 | 1 | 12.9 |
| C9 | 2.2 | |
| C10 | 5.6 | |
| C11 | 5.6 | |
| C12 | 5.6 | |
| C13 | 5.6 | 24.6 |
| | | 37.5 |

Fig. 6b

| # | C [nF] | ΣC [nF] |
|---|---|---|
| C1 | 6.8 | |
| C2 | 3.3 | |
| C3 | 1.8 | |
| C4 | 1 | 12.9 |
| C9 | 8.2 | |
| C10 | 8.2 | |
| C11 | 8.2 | |
| C12 | 6.8 | |
| C13 | 6.8 | 38.2 |
| | | 51.1 |

Fig. 6c

| # | Binary Conf. | C [nF] | ΣC [nF] | ΔC [nF] |
|---|---|---|---|---|
| 1 | 0000 | 0 | 18,9 | - |
| 2 | 0001 | 1 | 19,9 | 1 |
| 3 | 0010 | 1,8 | 20,7 | 0,8 |
| 4 | 0011 | 2,8 | 21,7 | 1 |
| 5 | 0100 | 3,3 | 22,2 | 0,5 |
| 6 | 0101 | 4,3 | 23,2 | 1 |
| 7 | 0110 | 5,1 | 24 | 0,8 |
| 8 | 0111 | 6,1 | 25 | 1 |
| 9 | 1000 | 6,8 | 25,7 | 0,7 |
| 10 | 1001 | 7,8 | 26,7 | 1 |
| 11 | 1010 | 8,6 | 27,5 | 0,8 |
| 12 | 1011 | 9,6 | 28,5 | 1 |
| 13 | 1100 | 10,1 | 29 | 0,5 |
| 14 | 1101 | 11,1 | 30 | 1 |
| 15 | 1110 | 11,9 | 30,8 | 0,8 |
| 16 | 1111 | 12,9 | 31,8 | 1 |

Fig. 7a

| # | Binary Conf. | C [nF] | ΣC [nF] | ΔC [nF] |
|---|---|---|---|---|
| 1 | 0000 | 0 | 24,6 | - |
| 2 | 0001 | 1 | 25,6 | 1 |
| 3 | 0010 | 1,8 | 26,4 | 0,8 |
| 4 | 0011 | 2,8 | 27,4 | 1 |
| 5 | 0100 | 3,3 | 27,9 | 0,5 |
| 6 | 0101 | 4,3 | 28,9 | 1 |
| 7 | 0110 | 5,1 | 29,7 | 0,8 |
| 8 | 0111 | 6,1 | 30,7 | 1 |
| 9 | 1000 | 6,8 | 31,4 | 0,7 |
| 10 | 1001 | 7,8 | 32,4 | 1 |
| 11 | 1010 | 8,6 | 33,2 | 0,8 |
| 12 | 1011 | 9,6 | 34,2 | 1 |
| 13 | 1100 | 10,1 | 34,7 | 0,5 |
| 14 | 1101 | 11,1 | 35,7 | 1 |
| 15 | 1110 | 11,9 | 36,5 | 0,8 |
| 16 | 1111 | 12,9 | 37,5 | 1 |

Fig. 7b

| # | Binary Conf. | C [nF] | ΣC [nF] | ΔC [nF] |
|---|---|---|---|---|
| 1 | 0000 | 0 | 38,2 | - |
| 2 | 0001 | 1 | 39,2 | 1 |
| 3 | 0010 | 1,8 | 40 | 0,8 |
| 4 | 0011 | 2,8 | 41 | 1 |
| 5 | 0100 | 3,3 | 41,5 | 0,5 |
| 6 | 0101 | 4,3 | 42,5 | 1 |
| 7 | 0110 | 5,1 | 43,3 | 0,8 |
| 8 | 0111 | 6,1 | 44,3 | 1 |
| 9 | 1000 | 6,8 | 45 | 0,7 |
| 10 | 1001 | 7,8 | 46 | 1 |
| 11 | 1010 | 8,6 | 46,8 | 0,8 |
| 12 | 1011 | 9,6 | 47,8 | 1 |
| 13 | 1100 | 10,1 | 48,3 | 0,5 |
| 14 | 1101 | 11,1 | 49,3 | 1 |
| 15 | 1110 | 11,9 | 50,1 | 0,8 |
| 16 | 1111 | 12,9 | 51,1 | 1 |

INDUCTION SEALING DEVICE FOR PRODUCING POURABLE FOOD PACKAGES

This application is a Section 371 of International Application No. PCT/EP2008/060650, filed Aug. 13, 2008, which was published on Feb. 19, 2009, under International Publication No. WO/2009/021979 and the disclosure of which is incorporated herein by reference.

TECHNICAL FIELD

The present invention relates in general to induction sealing for use to produce pourable food product packages by transversely sealing a sheet packaging material tube filled continuously with pourable product. More specifically, the present invention relates to an improved impedance matching circuit for use in a self-configuring induction sealing device to rephase current and voltage and so optimize power transfer to the inductor during the sealing operation.

BACKGROUND ART

As is known, many pourable food products (e.g. fruit or vegetable juice, pasteurized or UHT (ultra-high-temperature treated) milk, wine, etc.) are sold in packages made of sterilized packaging material.

A typical example of this type of package is the parallelepiped-shaped package for pourable food products known as Tetra Brik Aseptic®, which is made by folding and sealing laminated strip packaging material.

The laminated packaging material comprises layers of fibrous material, e.g. paper, covered on both sides with heat-seal plastic material, e.g. polyethylene. In the case of aseptic packages for long-storage products, such as UHT milk, the side of the packaging material eventually contacting the food product inside the package also has a layer of oxygen-barrier material, e.g. aluminium foil or EVOH film, which in turn is covered with one or more layers of heat-seal plastic material.

Figure 1:
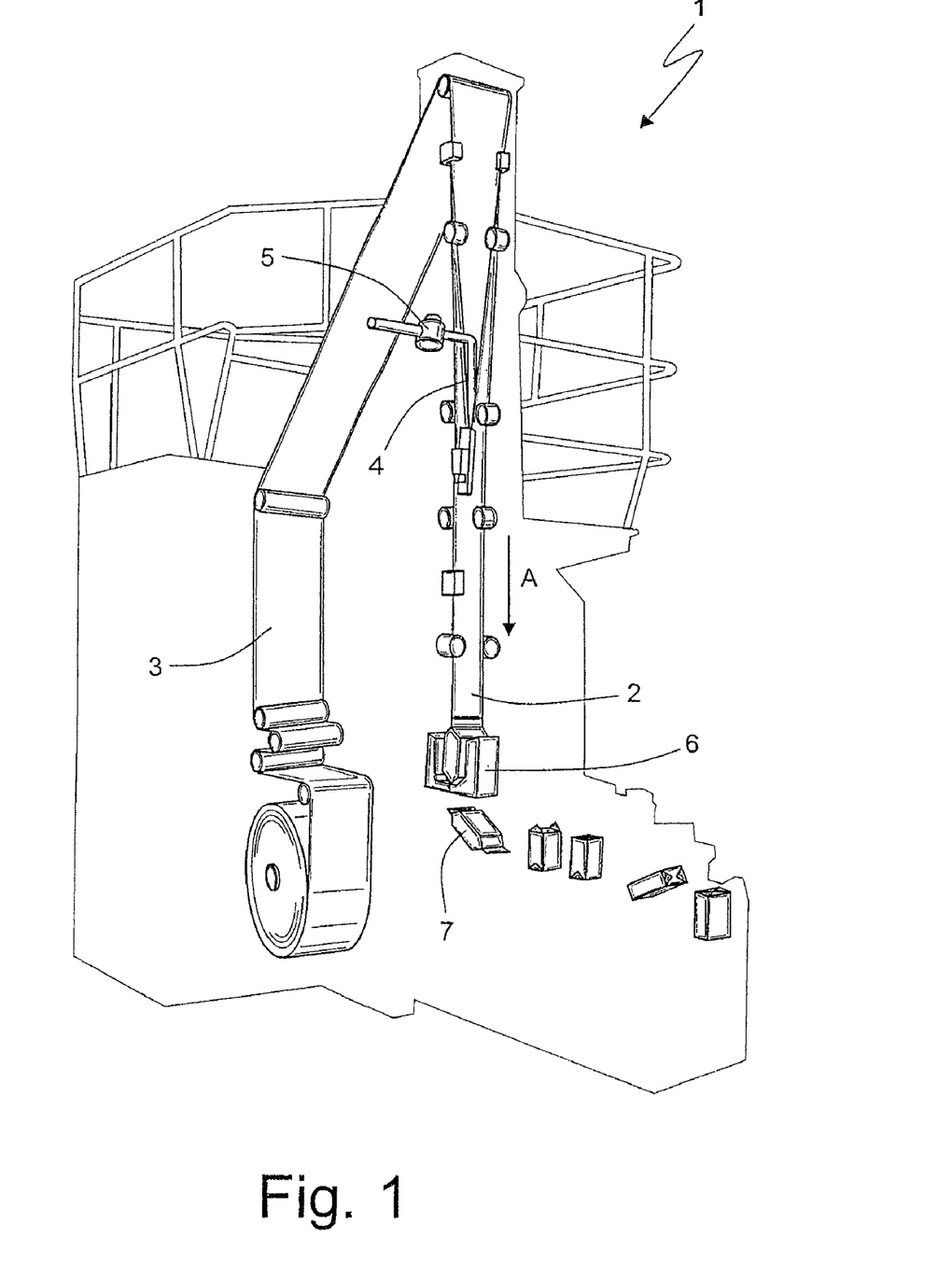
FIG. 1 shows a view in perspective, with parts removed for clarity, of a packaging machine for producing aseptic sealed packages of pourable food products from a tube of packaging material.

As is known, packages of this sort are produced on fully automatic packaging machines, of the type shown in FIG. 1, on which a continuous vertical tube 2 is formed from a web 3 of the packaging material. The web is sterilized on the packaging machine 1, e.g. by applying a sterilizing agent such as hydrogen peroxide, which is subsequently removed, e.g. evaporated by heating, from the surfaces of the packaging material; and the sterilized web 3 is maintained in a closed, sterile environment, and is folded and sealed longitudinally to form tube 2.

Tube 2 is then filled downwards with the sterilized or sterile-processed pourable food product, by means of a fill pipe 4 extending inside tube 2 and fitted with a flow-regulating solenoid valve 5, and is fed by known devices along a vertical path A to a forming station 6, where it is gripped along equally spaced cross section by two pairs of jaws. More specifically, the pairs of jaws act cyclically and successively on tube 2, and seal the packaging material of tube 2 to form a continuous strip of pillow packs 7 connected to one another by transverse sealing strips.

Pillow packs 7 are separated from one another by cutting the relative sealing strips, and are conveyed to a final folding station where they are folded mechanically into the finished parallelepiped shape.

In the case of aseptic packages with a layer of aluminium as the barrier material, the tube is normally sealed longitudinally and transversely by an induction sealing device, which induces parasitic electric current in the aluminium layer to locally melt the heat-seal plastic material. More specifically, for transverse sealing, one of the jaws in each pair comprises a main body made of non-conducting material, and an inductor housed in a front seat in the main body; and the other jaw is fitted with pressure pads made of pliable material, such as rubber.

When the relative pair of jaws grips the tube, the inductor is powered to seal a cross section of the tube by heat sealing the plastic cover material. When powered, the inductor generates a pulsating magnetic field, which in turn produces parasitic electric current in the aluminium sheet in the packaging material from which the vertical tube is made, thus locally melting the heat-seal plastic cover material.

More specifically, in addition to the inductor, the induction sealing device also comprises a signal source supplying a continuous or pulsating alternating power signal; and an impedance matching circuit interposed, to optimize power transfer, between the signal source and the inductor. More specifically, the impedance matching circuit is configured to eliminate or minimize the phase shift (angle), induced by the reactive impedance of the inductor, between the voltage and current supplied by the signal source, and so minimize the reactive power supplied by the signal source, and maximize the active power.

The alternating power signal conveniently comprises a sinusoidal voltage of roughly 535 kHz frequency and a peak amplitude of around a few hundred volts, normally 540 V. And the signal source supplies a maximum power of about 2500 Watts, when the phase between the current and voltage (both measured at the output) is close to zero.

Known matching circuits are normally inductive-capacitive types, in which a variable-capacitance capacitive element—normally defined by a number of selectively parallel-connectable capacitors—is parallel-connected to an inductive element normally defined by a transformer. The total capacitance of the capacitive element and the inductance of the inductive element are so selected as to rephase the output current and voltage from the source, i.e. to achieve a close to zero phase between the current and voltage.

Since phasing depends on the electric load connected to the source, and the electric load depends on the operating conditions of the packaging machine—such as the volume of the packs produced, the type of inductor employed, the production capacity and speed of the packaging machine, etc.—phasing is real-time adapted to variations in the electric load by acting accordingly on the impedance matching circuit. More specifically, during the package production process, a control stage, which may conveniently be integrated in the source, measures, in known manner not described in detail, electric parameters, such as the phase between the voltage and current from the signal source, and/or the impedance "seen" by the signal source, i.e. the input impedance of the impedance matching circuit, and determines the total capacitance required of the impedance matching circuit to eliminate or minimize the phase between the current and voltage of the source. After which, the control stage generates and supplies the impedance matching circuit with a control signal to modify the parallel connection configuration of the capacitors and so adjust the capacitance "seen" by the signal source.

Figure 2:
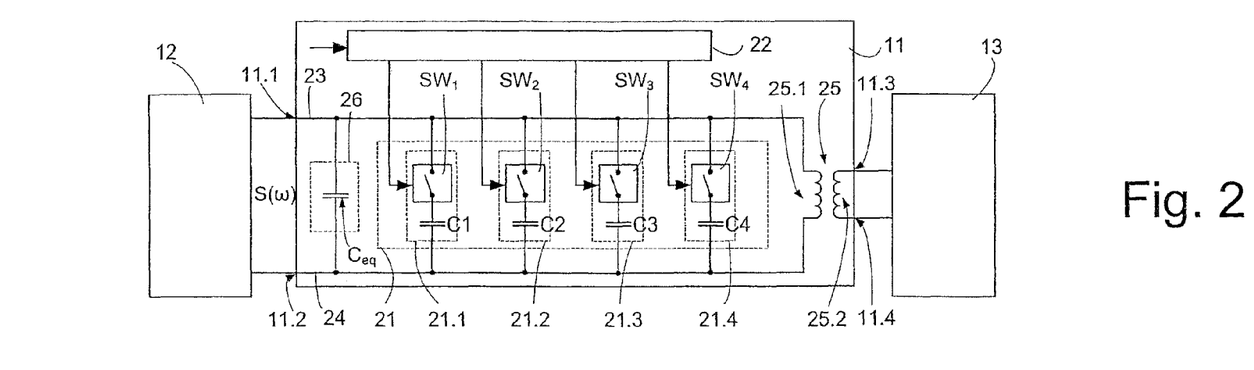
FIG. 2 shows a circuit diagram of a known self-configuring induction sealing device used on the FIG. 1 packaging machine.

A known induction sealing device is described, for example, in the Applicant's European Patent EP-B1-1 620 249, and its circuit architecture illustrated by way of reference in FIG. 2, in which 10 indicates the induction sealing device as a whole, 11 the impedance matching circuit, 12 the signal source, and 13 the inductor.

More specifically, impedance matching circuit 11 comprises:

two input terminals 11.1, 11.2, to which signal source 12 is connected, in use, and at which the alternating power signal S(ω) supplied by the signal source is present;

two output terminals 11.3, 11.4, to which inductor 13 is connected in use;

a first and a second line 23, 24 connected to respective input terminals 11.1, 11.2 of impedance matching circuit 11;

fixed-capacitance stage 26 shown schematically in FIG. 2 by an equivalent capacitor $C_{eq}$ connected between first line 23 and second line 24;

a variable-capacitance stage 21 defined by a number of—in the example shown, four—capacitive modules 21.1, 21.2, 21.3, 21.4 parallel-connected between first line 23 and second line 24, and each comprising a capacitor C1, C2, C3, C4 and a controlled switch SW1, SW2, SW3, SW4 connected in series; each controlled switch being selectively activated individually to connect the respective capacitor between first and second line 23, 24;

a transformer 25 having a primary winding 25.1 connected between first line 23 and second line 24, and a secondary winding 25.2 connected to output terminals 11.3, 11.4; and a control stage 22 for controlling the operating status (on/off) of switches SW1-SW4, and which is configured to measure, in known manner not described in detail, the phase between the voltage and current supplied by signal source 12, to determine the target capacitance required of impedance matching circuit 11 to eliminate or minimize the phase between the current and voltage, and to generate and supply switches SW1-SW4 with respective control signals to modify the connection configuration of capacitors C1-C4 between the first and second line, and so adjust the capacitance of variable-capacitance stage 21 and, hence, the equivalent capacitance "seen" by signal source 12.

Figure 3:
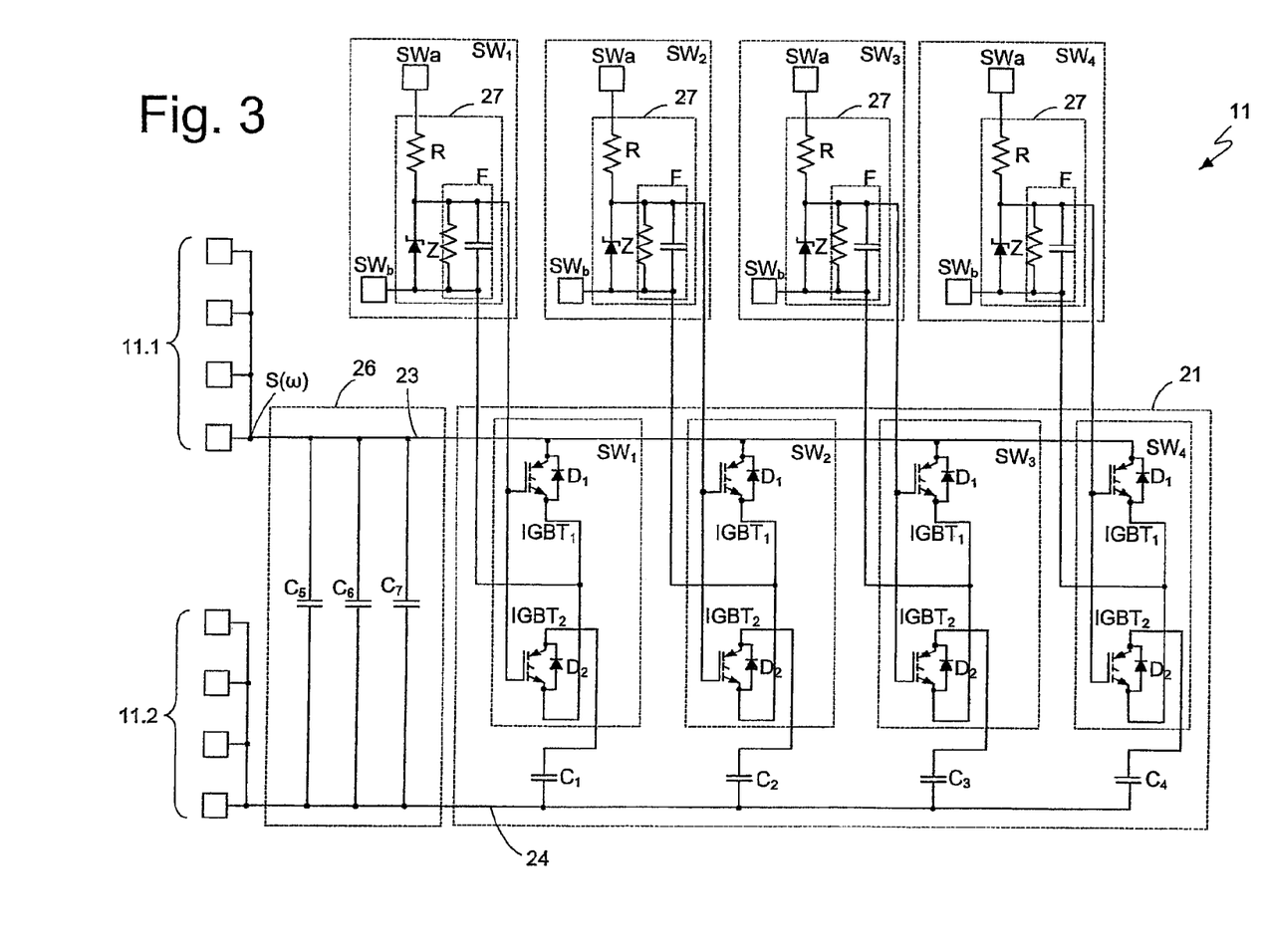
FIG. 3 shows an electric diagram of an impedance matching circuit forming part of the FIG. 2 induction sealing device.

A more detailed circuit diagram of impedance matching circuit 11 is shown in FIG. 3, which only shows the parts necessary for a clear understanding of the present invention, and in which component parts corresponding to those of the FIG. 2 impedance matching circuit are indicated using the same reference numbers.

More specifically, in the FIG. 3 impedance matching circuit 11:

input terminals 11.1, 11.2 are defined by four pairs of terminals, one pair of which is connected, in use, to signal source 12 (not shown), and another pair of which is connected, in use, to a respective pair of intermediate sockets of primary winding 25.1 of transformer 25 (not shown) to produce a specific transformation ratio;

in fixed-capacitance stage 26, equivalent capacitor $C_{eq}$ in FIG. 2 is defined by three capacitors C5, C6, C7;

in variable-capacitance stage 21, each controlled switch SW1-SW4 comprises:

a pair of input terminals SWa, SWb, to which a respective control signal supplied by control stage 22 is applied in use;

a pair of power transistors—in the example shown, insulated gate bipolar transistors—IGBT1, IGBT2, having the gate terminals connected to each other, the emitter terminals connected to each other, and the collector terminals connected, one to first line 23, and the other to second line 24 via a respective capacitor C1-C4; each power transistor also having a respective freewheeling diode D1, D2 parallel-connected to the power transistor, and with the anode connected to the emitter terminal, and the cathode connected to the collector terminal; and a bias and filter module 27 interposed between input terminals SWa, SWb of controlled switch SW1-SW4 and the two power transistors, and defined by a resistor R and a Zener diode Z series-connected between input terminals SWa, SWb of controlled switch SW1-SW4, and by a parallel RC type filter network F parallel-connected to Zener diode Z. More specifically, Zener diode Z has the cathode connected to a first input terminal SWa of controlled switch SW1-SW4 via resistor R, and the anode connected to a second input terminal SWb of controlled switch SW1-SW4. The second input terminal SWb of controlled switch SW1-SW4 is in turn connected to the emitter terminals of transistors IGBT1, IGBT2 of controlled switch SW1-SW4, and the intermediate node between resistor R and Zener diode Z is connected to the gate terminals of transistors IGBT1, IGBT2 of the respective controlled switch SW1-SW4.

During the package production process, control stage 22 measures the phase between the voltage and current from signal source 12, determines the total capacitance required of impedance matching circuit 11 to eliminate or minimize the phase, and then generates appropriate control signals for capacitive modules 21.1-21.4 to obtain an on/off configuration of transistors IGBT1, IGBT2, and hence a parallel-connection configuration of capacitors C1-C4 of variable-capacitance stage 21, which modifies the total capacitance "seen" by signal source 12 by such a quantity as to eliminate the phase between the voltage and current supplied by signal source 12.

Moreover, during a period of the alternating power signal, the capacitors C1-C4 of variable-capacitance stage 21 which are selectively connected between first and second line 23, 24, parallel to capacitors C5-C7 of fixed-capacitance stage 26, are each supplied with current which flows through the corresponding transistor IGBT1 and the freewheeling diode D2 of the corresponding transistor IGBT2 during the positive half-wave of the alternating power signal, and through the corresponding transistor IGBT2 and the freewheeling diode D1 of the corresponding transistor IGBT1 during the negative half-wave of the alternating power signal.

DISCLOSURE OF THE INVENTION

Though widely used, the impedance matching circuit in FIG. 3 has, in the Applicants opinion, several drawbacks which prevent full benefit being derived from the many advantages of the circuit.

More specifically, the Applicant has observed that, given the architecture of the impedance matching circuit—in particular, the fact that the emitter terminals of transistors IGBT1, IGBT2 are connected to the input terminals of the respective controlled switch, to which the controlled signals generated by the control stage are supplied—the electric potentials of the emitter terminals also depend, among other things, on the control signals generated by the control stage, and so float with respect to the first and second line, between which the alternating power signal is applied. As a result, the control signals supplied by the control stage to controlled switches SW1-SW4 must necessarily be generated by an additional electronic board separate and electrically insulated from the board on which the component parts of impedance matching circuit 1 are mounted, and comprising a DC-DC converter supplying a 24 V control voltage with 1 kV insulation, i.e. a control voltage capable of floating by at most 1 kV with respect to the alternating power signal.

Tests carried out by the Applicant have also revealed electromagnetic compatibility problems caused by electromagnetic fields disturbing operation of electronic boards in the immediate vicinity of the impedance matching circuit board.

The Applicant has also observed substantial electric current absorption and, hence, Joule-effect heat dissipation, mainly caused by the fairly high capacitance of the fixed-capacitance stage capacitors, and by power dissipation of the IGBT transistors when conducting.

Finally, the Applicant has observed a certain sluggishness in the impedance matching circuit switching from a higher- to lower-capacitance configuration, and which is mainly due to the slowness with which the control stage DC-DC converter turns off the controlled switches of the variable-capacitance stage.

It is an object of the present invention to provide an induction sealing device designed to eliminate the aforementioned drawbacks of known devices.

According to the present invention, there are provided an induction sealing device for use to produce pourable food product packages by transversely sealing a tube of sheet packaging material; and a packaging machine for continuously producing sealed packages of a pourable food product from a tube of heat-seal sheet packaging material, as claimed in the accompanying Claims.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 4:
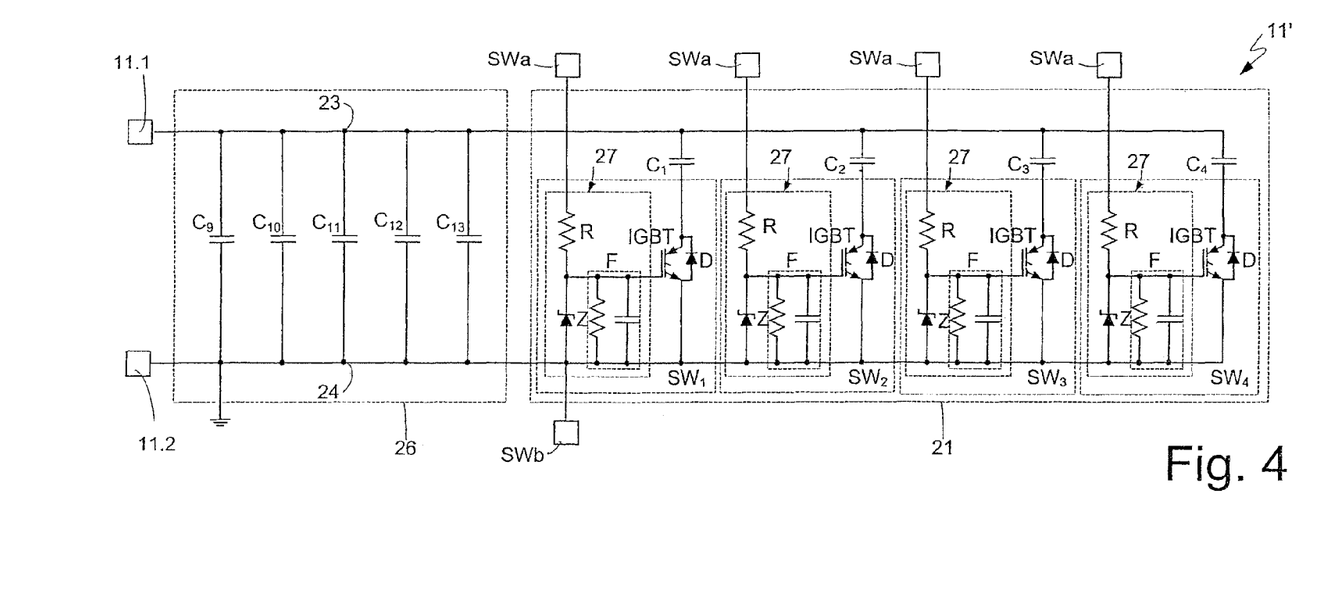
FIG. 4 shows an electric diagram of an impedance matching circuit in accordance with the present invention and for use in an induction sealing device of the type shown in FIG. 2.

FIG. 4 shows an electric diagram of an impedance matching circuit in accordance with the present invention and for use in an induction sealing device of the type shown in FIG. 2. More specifically, the FIG. 4 impedance matching circuit is similar to the one in FIG. 3, and is therefore described below only insofar as it differs from the FIG. 3 circuit, and using the same reference numbers for component parts corresponding to those of the FIG. 3 impedance matching circuit.

More specifically, the impedance matching circuit according to the present invention, and indicated 11' in FIG. 4, differs from impedance matching circuit 11 in FIG. 3 as follows:
input terminals 11.1 and 11.2 are defined by one pair of terminals, which are connected to first and second line 23, 24, and between which are connected, in use, both signal source 12 (not shown) and primary winding 25.1 of transformer 25 (not shown); and one of the two input terminals 11.1, 11.2—in particular, the one connected to second line 24—is grounded;

fixed-capacitance stage 26 comprises five capacitors C9, C10, C11, C12, C13 connected between first line 23 and second line 24; and in variable-capacitance stage 21, one of the two input terminals—input terminal SWb in the example shown—is connected to the grounded second line 24, and each controlled switch SW1-SW4 is defined by one power transistor—in the example shown, an insulated gate bipolar transistor—IGBT having a gate terminal connected to the respective bias and filter module F, an emitter terminal connected to second line 24, and a collector terminal connected to first line 23 via respective capacitor C1-C4; and each transistor IGBT has a freewheeling diode D parallel-connected to transistor IGBT, and having the anode connected to the emitter terminal, and the cathode connected to the collector terminal of transistor IGBT.

In actual use, during a period of the alternating power signal, the capacitors of variable-capacitance stage 21 which are selectively connected between the first and second line, parallel to the capacitors of fixed-capacitance stage 26, are each supplied with current which flows through the corresponding transistor IGBT during the positive half-wave of the alternating power signal, and through the freewheeling diode D of transistor IGBT during the negative half-wave of the alternating power signal.

Figure 6A:
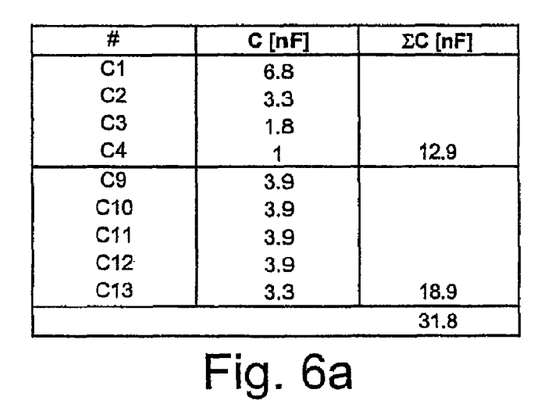
FIGS. 6a, 6b, 6c and 7a, 7b, 7c show tables relative to the FIG. 4 impedance matching circuit.
Figure 6B:
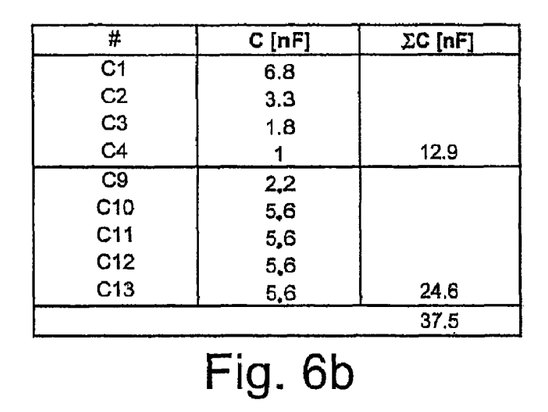
Figure 6C:
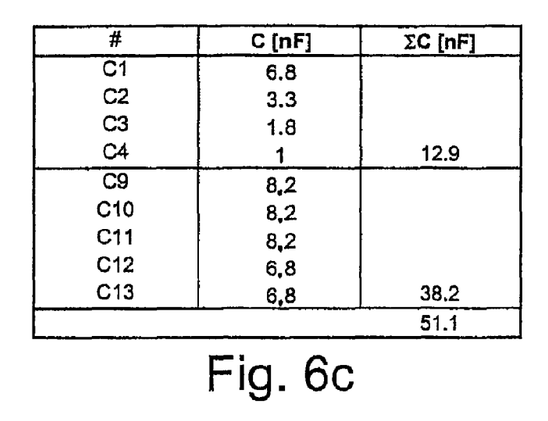
Figure 7A:
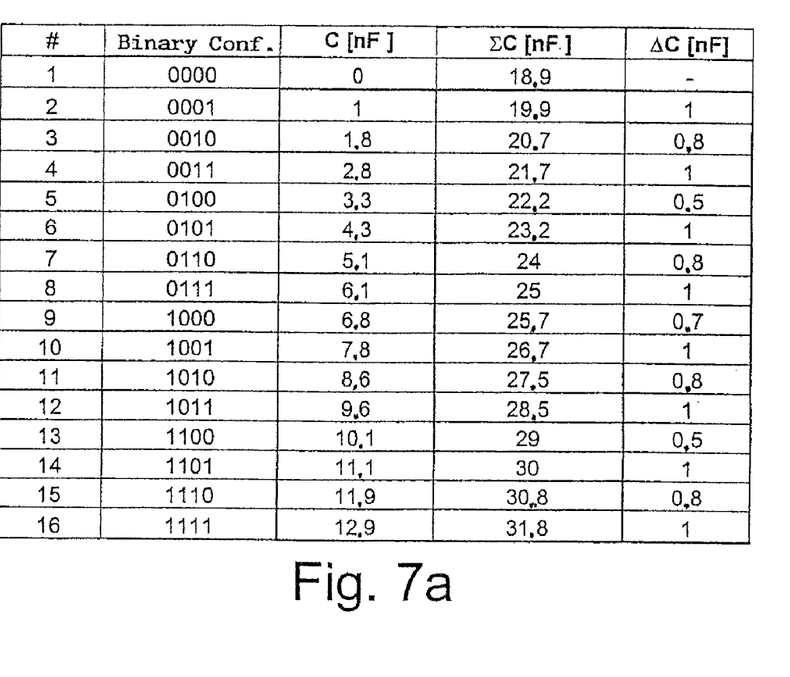
Figure 7B:
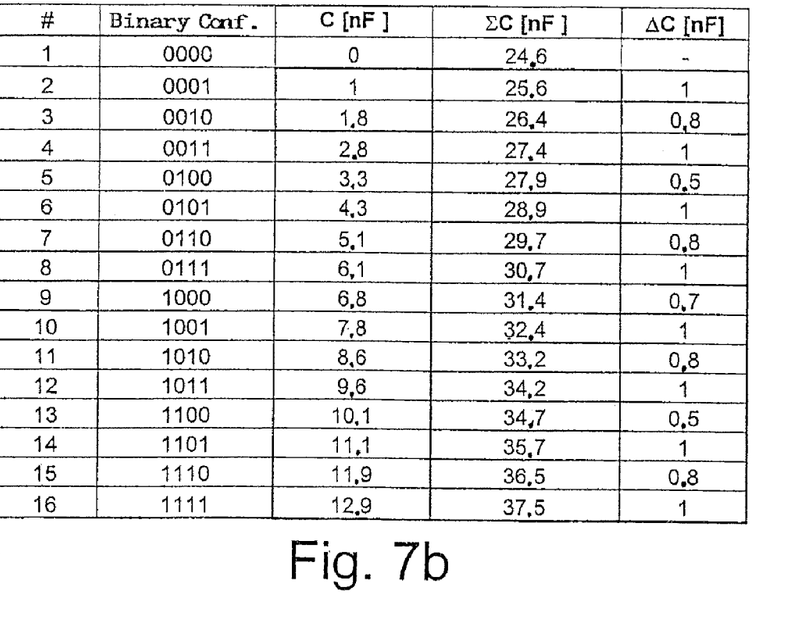
Figure 7C:
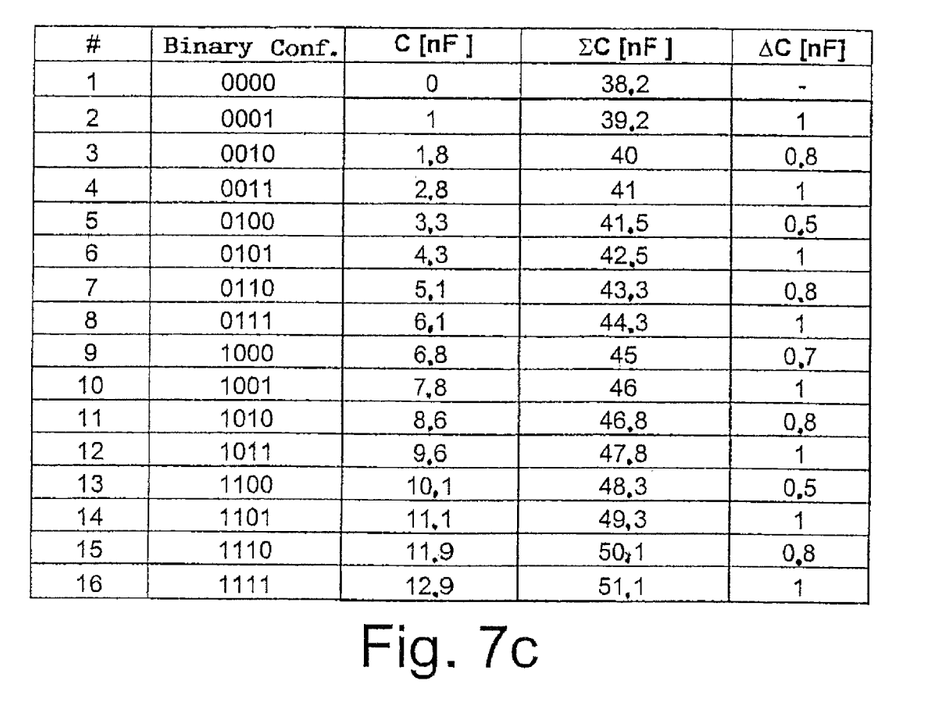

The capacitances of capacitors C1-C4 of variable-capacitance stage 21 are conveniently chosen to achieve a monotone total capacitance of impedance matching circuit 11'. The FIG. 6a, 6b, 6c tables show three examples of capacitor capacitances and total capacitances of fixed- and variable-capacitance stages 26, 21; and the FIG. 7a, 7b, 7c tables show three examples of total capacitances and of variations in capacitance of the variable-capacitance stage and impedance matching circuit 11' alongside variations in the open/close configuration of the power transistors (binary-coded).

As stated, control stage 22 generates appropriate control signals for transistors IGBT to obtain a parallel-connection configuration of capacitors C1-C4 of variable-capacitance stage 21, which eliminates the phase between the voltage and current supplied by signal source 12.

Figure 5:
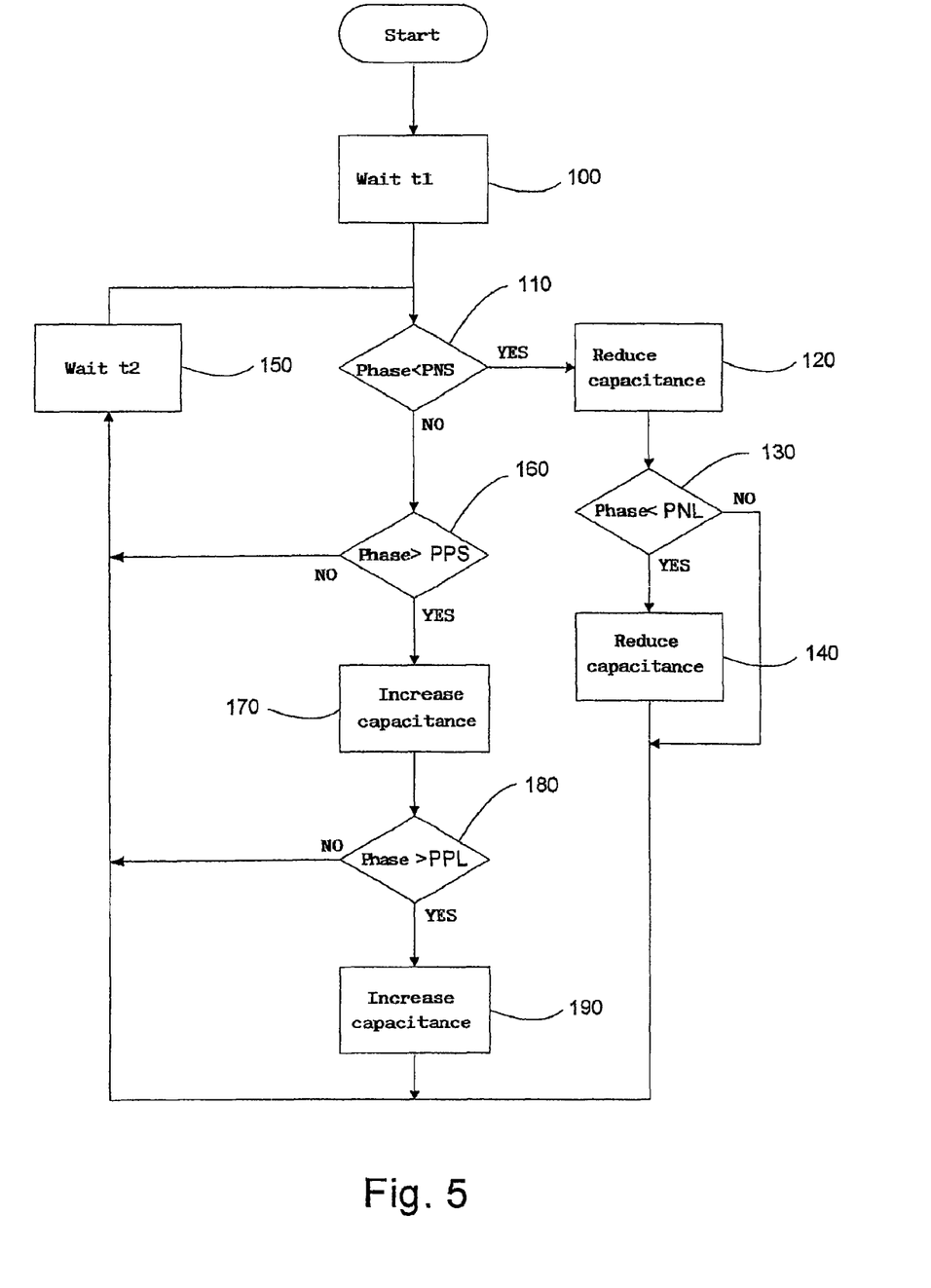
FIG. 5 shows an operating flow chart of the FIG. 4 impedance matching circuit.

More specifically, control stage 22 implements an adaptation algorithm to adapt the on/off configuration of transistors IGBT, as described below with reference to the FIG. 5 flow chart.

The adaptation algorithm is based on comparing the phase between the voltage and current supplied by signal source 12 with the following four different thresholds:
a first and second threshold, indicated PNS and PNL respectively, indicating a low and high negative phase shift, e.g. of −15° and −25°, respectively; and
a third and fourth threshold, indicated PPS and PPL respectively, indicating a low and high positive phase shift, e.g. of +15° and +25°, respectively.

More specifically, after an initial wait time t1, e.g. of about 20 ms (block 100), control stage 22 determines whether the phase between the voltage and current supplied by signal source 12 is below first threshold PNS (block 110). If it is (YES output of block 110), control stage 22 controls controlled switches SW1-SW4 to reduce the total capacitance of variable-capacitance stage 21 by a quantity corresponding to one unit in the controlled switch SW1-SW4 open/close binary configuration in the 7a, 7b, 7c tables (block 120).

Control stage 22 then determines whether the phase between the voltage and current supplied by signal source 12 is also below second threshold PNL (block 130). If it is not (NO output of block 130), which corresponds to a phase between first and second thresholds PNS and PNL, operation commences again from block 110, after a wait time t2, e.g. of about 5 ms (block 150). Conversely (YES output of block 130), control stage 22 controls controlled switches SW1-SW4 to reduce the total capacitance of variable-capacitance stage 21 by a further quantity corresponding to one unit in the controlled switch SW1-SW4 open/close binary configuration (block 140). After which, in this case too, operation again commences from block 110.

In the event the phase between the voltage and current supplied by signal source 12 is above first threshold PNS (NO output of block 110), control stage 22 determines whether it is also above third threshold PPS (block 160). If it is not (NO output of block 160), operation commences again from block 150. Conversely (YES output of block 160), control stage 22 controls controlled switches SW1-SW4 to increase the total capacitance of variable-capacitance stage 21 by a quantity corresponding to one unit in the controlled switch SW1-SW4 open/close binary configuration (block 170).

Control stage 22 then determines whether the phase between the voltage and current supplied by signal source 12 is also above fourth threshold PPL (block 180). If it is not (NO output of block 180), which corresponds to a phase between third and fourth thresholds PPS and PPL, operation commences again from block 150. Conversely (YES output of block 180), control stage 22 controls controlled switches SW1-SW4 to increase the total capacitance of variable-capacitance stage 21 by a further quantity corresponding to one unit in the controlled switch SW1-SW4 open/close binary configuration (block 190). After which, operation again commences from block 150.

By virtue of the above operations, when the phase between the voltage and current supplied by signal source 12 is considerable (below −25° or above +25°), the total capacitance of variable-capacitance stage 21 is increased or reduced at each iteration by twice the amount by which it is increased or reduced when the phase between the voltage and current is not excessive (between −25° and −15° or between +15° and +25°).

The advantages of impedance matching circuit 11' according to the present invention will be clear from the foregoing description.

In particular, in impedance matching circuit 11' according to the present invention, the emitter terminals of transistors IGBT1-IGBT4 being connected to second line 24, the electric potentials of the emitter terminals no longer float with respect to, but in fact are at, ground potential, so all the electronic components of impedance matching circuit 11', including those of control stage 22, can be mounted on the same electronic board.

This provides for a number of important advantages, one being a reduction in electromagnetic field emissions which may disturb operation of the electronic boards in the immediate vicinity of the impedance matching circuit 11' board. This is due mainly to reducing the number of power transistors and the length of the relative connecting tracks, thus simplifying the architecture of impedance matching circuit 11', and to eliminating the electric wiring which, in known impedance matching circuit 11, connect the two electronic boards fitted with the component parts of control stage 22 and the other component parts of impedance matching circuit 11' respectively.

Moreover, for a given occupancy area on the electronic board, by reducing the number of power transistors, fixed-capacitance stage 26 may comprise a larger number of capacitors, each of which, for a given total capacitance of fixed-capacitance stage 26, may therefore have a lower capacitance than the capacitors in FIG. 3, thus reducing current absorption and Joule-effect heat dissipation.

Finally, reducing the number of power transistors increases the speed with which variable-capacitance stage 21 switches from a higher- to lower-capacitance configuration.

Clearly, changes may be made to impedance matching circuit 11' according to the present invention and as described and illustrated herein without, however, departing from the scope of the present invention as defined in the accompanying Claims.

In particular, the power transistors may be of a different type from that described; and the number of capacitors of fixed-capacitance stage 26 and variable-capacitance stage 21, and hence the number of control modules of control stage 22, may differ from that described and illustrated.

Also, fixed-capacitance stage 26 may even be eliminated, and the total capacitance of impedance matching circuit 11' be obtained solely by means of variable-capacitance stage 21.

The invention claimed is:

1. An induction sealing device for use to produce pourable food product packages from a tube of heat-seal sheet packaging material, said induction sealing device comprising:
   a signal source configured to generate an alternating power signal;
   an inductor connected to said signal source to receive said alternating power signal, and operable to induce an electric current in said sheet packaging material to heat seal the sheet packaging material; and
   an impedance matching circuit connected between said signal source and said inductor;
   said impedance matching circuit comprising:
   a pair of input terminals configured to receive, in use, said alternating power signal;
   a first line and a second line connected respectively to said input terminals of said impedance matching circuit;
   a variable-capacitance stage comprising at least one capacitive module connected between said first and second line and comprising a capacitive element and a controlled switch series-connected to each other; said controlled switch being selectively operable to connect said capacitive element between said first and second line; and
   a control stage configured to control an operating status of said controlled switch;
   wherein said controlled switch comprises:
   a pair of input terminals configured to receive, in use, a control signal from said control stage; one of said input terminals being connected to said second line; and
   a single two-way controlled switching element having a first current-conducting terminal connected to said first line via said capacitive element; a second current-conducting terminal connected to said second line; and a control terminal connected to said input terminals of said controlled switch to receive said control signal from said control stage.

2. An induction sealing device as claimed in claim 1, wherein said variable-capacitance stage comprises a plurality of said capacitive modules parallel-connected between said first and second line.

3. An induction sealing device as claimed in claim 1, further comprising:
   a fixed-capacitance stage comprising at least one capacitive element connected between said first and second line.

4. An induction sealing device as claimed in claim 1, wherein said two-way controlled switching element comprises a power transistor, and a diode parallel-connected to said power transistor.

5. An induction sealing device as claimed in claim 4, wherein said power transistor comprises an insulated gate bipolar transistor.

6. An induction sealing device as claimed in claim 1, wherein said controlled switch further comprises:
   a bias and filter module connected between said pair of input terminals of said controlled switch and said two-way controlled switching element.

7. An induction sealing device as claimed in claim 6, wherein said bias and filter module comprises a resistor and a Zener diode series-connected between said input terminals of said controlled switch; and a filtration network parallel-connected to said Zener diode; the Zener diode having a cathode connected to said first input terminal of said controlled switch via said resistor, and an anode connected to said second input terminal of said controlled switch; an intermediate node between said resistor and said Zener diode being connected to said control terminal of the respective controlled switch.

8. An induction sealing device as claimed in claim 1, wherein said control stage is configured to:
   measure a quantity indicating impedance matching of said signal source;
   compare said quantity with a number of thresholds indicating respective degrees of impedance matching; and
   control the operating status of the controlled switches of said variable-capacitance stage to modify the capacitance of said variable-capacitance stage by a first quantity when said quantity is within a first range defined by a first and second threshold; and
   control the operating status of the controlled switches of said variable-capacitance stage to modify the capacitance of said variable-capacitance stage by a second quantity, greater than said first quantity, when said quantity is outside said first range.

9. An induction sealing device as claimed in claim 8, wherein measuring a quantity indicating impedance matching of said signal source comprises:
   measuring a phase between a voltage and current supplied by said signal source.

10. An induction sealing device as claimed in claim 8, wherein said second quantity is twice said first quantity.

11. An induction sealing device as claimed in claim 8, wherein the capacitance of said variable-capacitance stage is modified by said first quantity, when said quantity is within said first range and also outside a second range defined by a third and fourth threshold.

12. A packaging machine for continuously producing sealed packages of a pourable food product from a tube of heat-seal sheet packaging material, said packaging machine comprising an induction sealing device as claimed in claim 1.

* * * * *